United States Patent
Gall et al.

(10) Patent No.: US 6,355,954 B1
(45) Date of Patent: Mar. 12, 2002

(54) DEVICE WITH ASYMMETRICAL CHANNEL DOPANT PROFILE

(75) Inventors: Martin Gall; Johann Alsmeier, both of Wappingers Falls, NY (US)

(73) Assignee: Siemens Aktiengesellscahft, Munich (DE)

( * ) Notice: Subject to any disclaimer, the term of this patent is extended or adjusted under 35 U.S.C. 154(b) by 0 days.

(21) Appl. No.: 09/251,616

(22) Filed: Feb. 17, 1999

Related U.S. Application Data (62) Division of application No. 08/829,371, filed on Mar. 31, 1997.

(51) Int. Cl.[7] ............................................. H01L 21/108
(52) U.S. Cl. ...................... 257/297; 257/296; 257/905
(58) Field of Search ................... 257/516, 296, 257/297, 301, 372, 394, 547, 905

(56) References Cited

U.S. PATENT DOCUMENTS

| | | | | |
|---|---|---|---|---|
| 4,918,503 A | * | 4/1990 | Okuyama | 357/23.6 |
| 5,017,982 A | * | 5/1991 | Kobayashi | 257/306 |
| 5,218,221 A | * | 6/1993 | Okumura | 257/336 |
| 5,223,730 A | * | 6/1993 | Rhodes et al. | 257/296 |
| 5,234,856 A | * | 8/1993 | Gonzalez | 438/244 |
| 5,264,716 A | * | 11/1993 | Kenney | 257/301 |
| 5,448,090 A | * | 9/1995 | Geissler et al. | 257/305 |
| 5,451,807 A | * | 9/1995 | Fujita | 257/404 |
| 5,510,279 A | * | 4/1996 | Chien et al. | 438/302 |
| 5,783,457 A | * | 7/1998 | Hsu | 438/302 |
| 5,936,277 A | * | 8/1999 | Takeuchi | 257/336 |

* cited by examiner

Primary Examiner—Carl Whitehead, Jr.
Assistant Examiner—Jeff Vockrodt

(57) ABSTRACT

A method for fabricating a bit line junction in a DRAM array device which improves the doping profile in the channel region. The method includes contradoping via ion implantation through the bit line contact opening made in the device during processing. This particular doping method increases the concentration of dopants in the channel region on the bit line side of the array, without a corresponding increase of dopants on the buried strap side. Such a doping profile results in an improvement in the off current behavior of the device. Depending on the aspect ratio of the contact opening, tilt angles for the ion implantation are possible and can be adjusted for maximum off current efficiency.

16 Claims, 11 Drawing Sheets

DEVICE WITH ASYMMETRICAL CHANNEL DOPANT PROFILE

This is a divisional, of application Ser. No. 08/829,371 filed Mar. 31, 1997.

FIELD OF THE INVENTION

The field of the present invention relates generally to devices and the fabrication of devices. More particularly, the invention relates to devices with an asymmetrical channel dopant profile which improves the off current behavior and the fabrication of such devices.

BACKGROUND OF THE INVENTION

The fabrication of modem integrated circuits (ICs) involves the formation of features that make up devices, such as transistors and capacitors, and the interconnection of such devices to achieve a desired electrical function. Since the cost of fabricating ICs is inversely related to the number of ICs per wafer, there is a continued demand to produce a greater number of ICs per wafer. With the advent of new photolithographic techniques, fabrication of features with increasingly smaller dimensions was made possible, thereby increasing the density of devices which in turn increases the number of ICs per wafer.

In particular, the fabrication of random access memories (RAMs), such as dynamic random access memories (DRAMs), has fostered significant advances in improving device density. Typically, DRAMs comprise memory cells that are configured in rows (wordlines) and columns (bitlines) to provide storage of information. A memory cell comprises a pass transistor connected to, for example, a storage capacitor referred to as the "node" or "storage node". The pass transistor comprises a source, a drain, and a gate. Oppositely charged dopants having varying concentrations are, for example, ion implanted or diffused into the semiconductor substrate to form the source, channel which is located beneath the gate, and drain of the transistor. These various oppositely charged doped regions may be referred to in the art as retrograde or contradoped wells. Generally in a DRAM cell, the source corresponds to the bitline, the gate corresponds to the wordline, and the drain is coupled to the node. Support circuitry, such as row and column address decoders, drivers, and sense amplifiers, are used to activate the desired cell or cells within the array of cells. When a cell is activated, the transistor allows data to be read or written into the node.

An important consideration in designing the pass transistor is its off current ($I_{off}$) characteristic. The $I_{off}$ is directly related to the leakage current of the storage node. Thus, $I_{off}$ impacts the retention time of the storage node. $I_{off}$ is determined by the dopant profile in the channel. This dopant profile controls the gate threshold voltage ($V_t$). As the dimensions of the transistors become smaller, the dopant concentration of the $V_t$ implant needs to be increased to achieve reasonable $I_{off}$ characteristics, resulting in adequate storage node retention time.

However, increasing the dopant concentration of the channel to decrease $I_{off}$ produces high fields on the node side of the channel. Such high fields increases leakage current from the node, countering the effect of in creased $V_t$.

From the above discussion, it is apparent that there is a need to provide a device with reasonable $I_{off}$ and low leakage current.

SUMMARY OF THE INVENTION

A method for fabricating a bit line junction in a DRAM array device which improves the doping profile in the channel region. The method includes contradoping via ion implantation through the bit line contact opening made in the device during processing. This particular doping method increases the concentration of dopants in the channel region on the bit line side of the array, without a corresponding increase of dopants on the buried strap side. Such a doping profile results in an improvement in the off current behavior of the device. Depending on the aspect ratio of the contact opening, tilt angles for the ion implantation are possible and can be adjusted for maximum off current efficiency.

BRIEF DESCRIPTION OF THE DRAWINGS

In order to better understand the present invention, reference should be made to the following detailed description taken in conjunction with the accompanying drawings wherein.

DETAILED DESCRIPTION OF THE INVENTION

The present invention relates to a device with reasonable $I_{off}$ characteristics with reduced leakage current from connected devices. For purposes of illustration, the invention is described in the context of a DRAM cell employing a trench capacitor. However, the invention is significantly broader and extends to devices having an acceptable $I_{off}$ and reduced leakage current. To facilitate discussion of the invention, a description of a conventional trench capacitor DRAM cell is provided.

Figure 1:
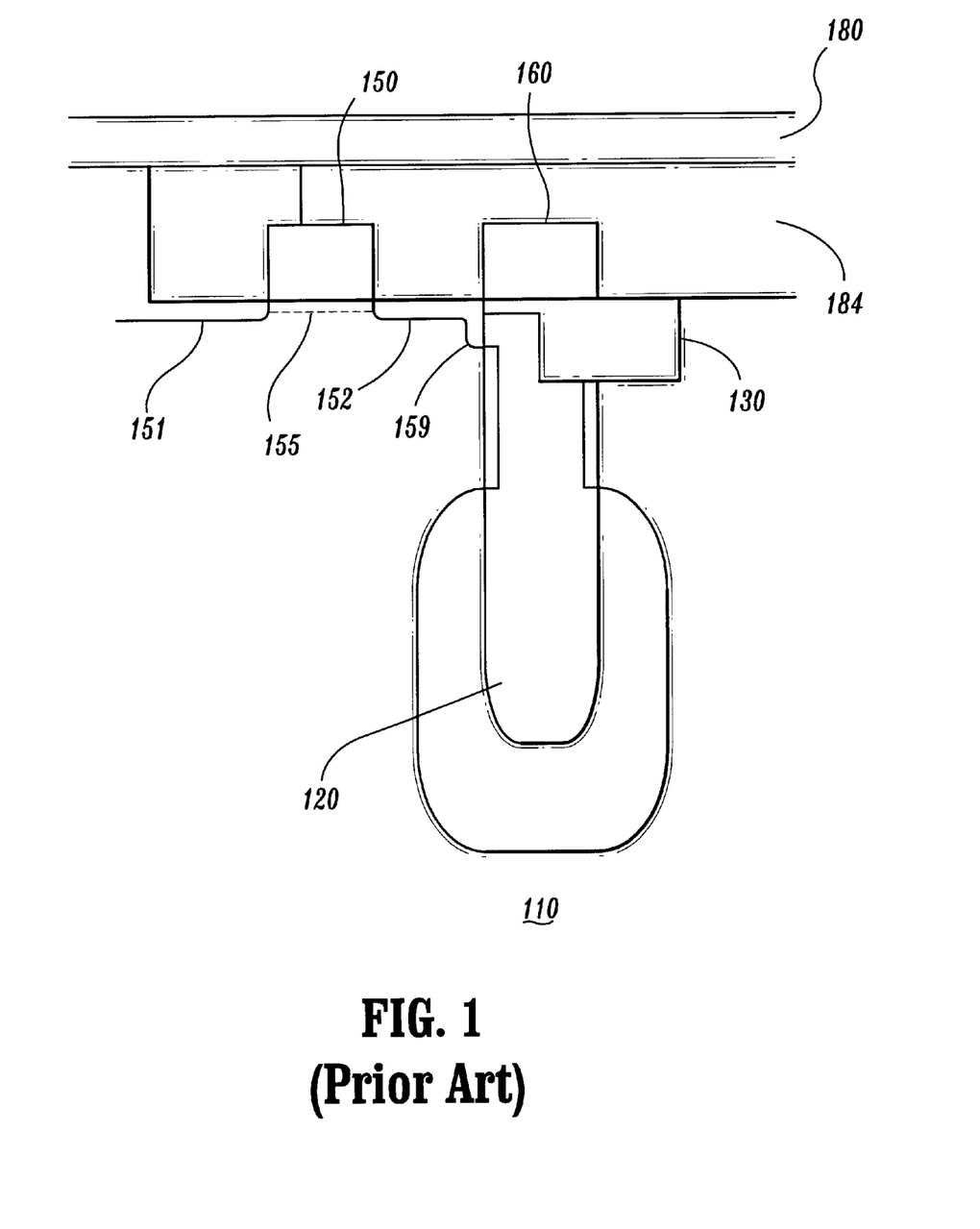
FIG. 1 shows a partial cross sectional view of a conventional 256 MB DRAM cell.

FIG. 1 shows a DRAM cell 105. Such DRAM cell is described in, for example, Nesbit et al., *A 0.6 μm² 256 Mb Trech DRAM Cell With Self-Aligned BuriEd STrap (BEST)*, IEDM 93–627, which is herein incorporated by reference for all purposes. Typically, an array of DRAM cells are interconnected by wordlines and bitlines to form a DRAM chip.

Illustratively, the DRAM cell comprises a trench capacitor 110 for storing data. The trench is formed in a substrate 101 which, for example, is lightly doped with a p-type dopant such as boron (B). The trench is typically filled with heavily doped n-type polysilicon (poly) 120. A pass transistor 150 comprising a gate stack 155, source 151, and drain 152 is connected to the trench. The drain and source are formed by, for example, implanting phosphorus (P) dopants. B dopants are provided beneath the gate, forming the channel. Generally, the gate and source represent the wordline and bitline, respectively, in the DRAM array A gate stack 160 is provided above the trench 110. Gate stack 160, referred to as a passing wordline, is isolated from the trench by a shallow trench isolation (STI) 130. The STI also isolates the DRAM cell from other DRAM cells in the array.

As shown, the source of the transistor is coupled to a bitline 180 by, for example, a poly stud 175. The bitline and gates are isolated from each other by a dielectric layer 184 comprising, for example, BPSG. Activation of the transistor by providing the appropriate voltages at the source (bitline) and gate (wordline) enables data to be written or read from the trench capacitor.

In fabricating the DRAM cell 105, the trench 110 is first formed in a substrate which, for example, is lightly doped with B. The substrate is planarized, leaving the top surface of the STI planar with the substrate. The portion of the substrate where the channel of the transistor 150 is located is implanted with B. This implant is used to adjust the $V_t$ of the pass transistor, which determines the $I_{off}$. Since the $V_t$ implant comprises dopants having the same conductivity as that of the substrate, it is typically referred to as a retrograde implant.

To selectively implant the ions into the channel region of the substrate, a mask comprising resist, for example, is formed and patterned by conventional lithographic techniques on the surface of the substrate. The resulting dopant profile under the channel is symmetrical or homogenous. That is, the concentration of dopants throughout the channel is substantially consistent, as depicted by a dotted line 155.

The gate stacks 150 and 160 along with the gate oxidation are formed after the $V_t$ implant. P dopants are implanted, using the gate stacks as a mask, to form the source 151 and drain 152. Since P dopants have an opposite conductivity than the B doped substrate, the source/drain implant is referred to as a contradoping implant. During thermal processes that form the DRAM cell, dopants from the doped trench poly outdiffuses to formed the buried strap 159.

The dielectric layer 184 is formed over the transistors and surface of the substrate. A contact opening is provided in the dielectric layer above the source region and filled with heavily doped n-type poly. Metal, such as aluminum, is deposited above the dielectric layer, forming the bitline. The bitline is isolated from the transistors by the dielectric layer, except for the conductive path between the source and the bitline provided by the poly stud.

The above is an simplified description of a DRAM cell and process sequence involved in the fabrication of such for purposes of illustration. Of course, the actual DRAM cell and process sequence may involve additional elements and steps. These additional elements and steps are well-known and are described in, for example, Nesbit et al., *A 0.6 $\mu m^2$ 256 Trench DRAM Cell With Self-Aligned BuriEd STrap (BEST)*, IEDM 93–627, which is already herein incorporated by reference for all purposes.

As previously discussed, continued shrinkage of channel length requires a higher $V_t$ to achieve a reasonable $I_{off}$. To increase the $V_t$, the concentration of B dopants within the channel is increased. From the above discussion, conventional DRAM fabrication results in a substantially homogenous dopant concentration throughout the channel. As such, increasing the dopant concentration in the channel also results in an increase in the dopant concentration at the P/N junction between the channel and the drain. However, increasing the B concentration at the channel/drain junction adversely affects the integrity of this junction due to increased junction fields. For example, lower junction integrity causes leakage current to increase. Since the storage capacitor is connected to the drain, increase leakage current from the capacitor through the drain/channel junction results, decreasing retention time of the capacitor.

In accordance with the invention, a transistor with reasonable $I_{off}$ and reduced leakage current in the channel/drain junction is provided. The device comprises an asymmetrical dopant profile in the channel. The asymmetrical dopant profile is formed without adversely impacting the integrity of the channel/drain junction.

Figure 2:
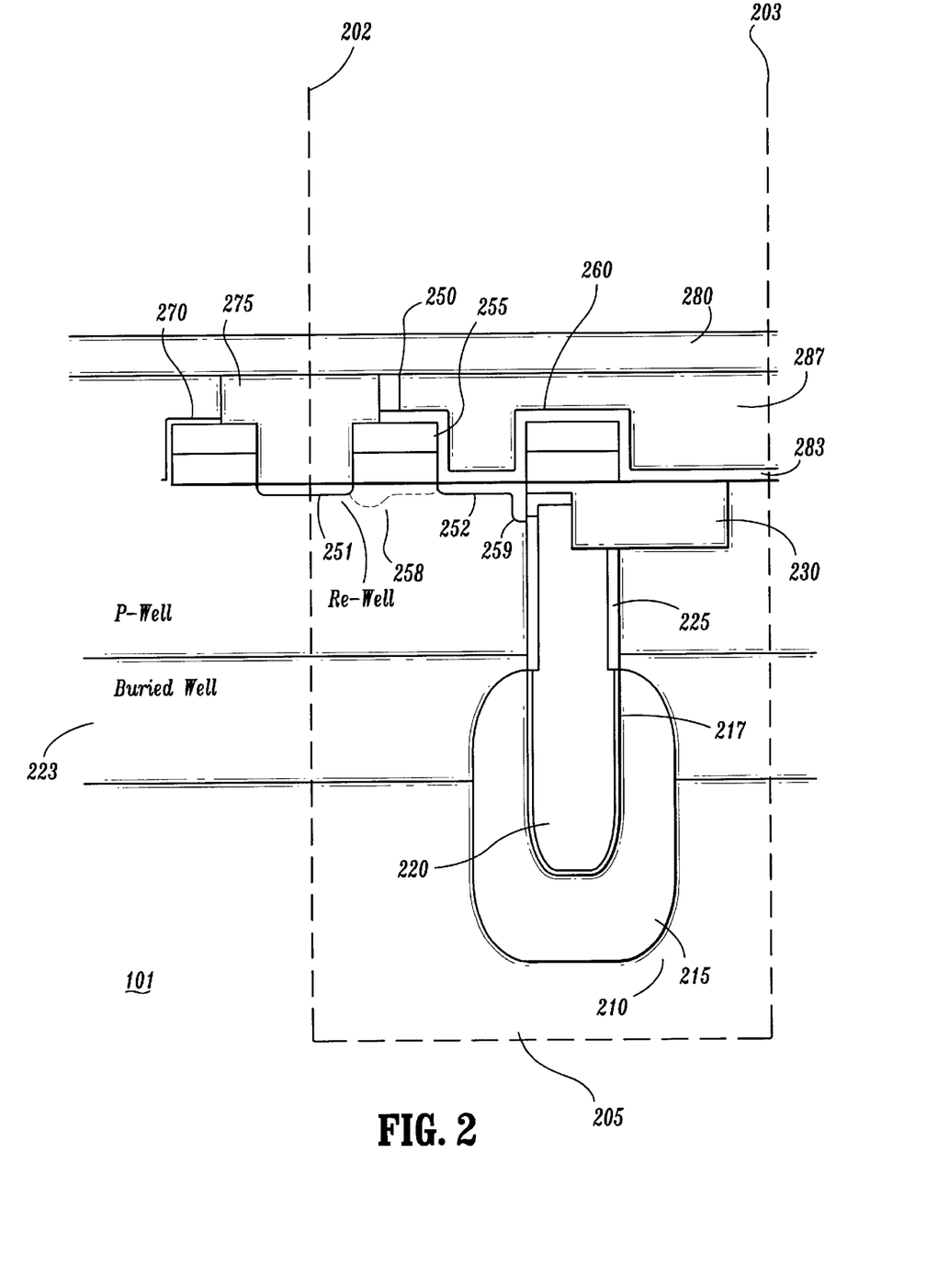
FIG. 2 depicts a partial cross sectional view of a 256 MB DRAM cell in accordance with one embodiment of the invention.

FIG. 2 shows an illustrative embodiment of the invention as implemented in a DRAM cell 205. The DRAM cell 205 is delineated by the dotted lines 202 and 203. As shown, the DRAM cell comprises a trench capacitor 210 formed in, for example, a substrate 101 lightly doped with a dopant having a first conductivity. Such trench capacitor is described in, Nesbit et al., *A 0.6 $\mu m^2$ 256 Mb Trech DRAN Cell With Self-Aligned BuriEd STrap (BEST)*, IEDM 93–627, which is already herein incorporated by reference for all purposes. The trench is typically filled with polysilicon (poly) 220 heavily doped with dopants having a second conductivity. The poly serves as one plate of the capacitor. The other plate of the capacitor is formed by a buried plate 215, also having a second conductivity. Separating the two plates is a dielectric layer 217. To improve the quality of the dielectric layer, it comprises a nitride layer formed on the trench sidewall and then an oxide layer formed thereon.

A buried well 223, also having dopants of the second conductivity, is provided below the surface of the substrate at about the midsection of the trench. The peak concentration of dopants in this well is at about the bottom of a collar 225. The collar comprises, for example oxide sufficiently thick to prevent punchthrough of the node to the buried plate. Typically, the well is lightly doped. The buried well connects the buried plates of the DRAM cells in the array together, forming a common plate. The buried well is coupled to reference potential (not shown). In one embodiment, the reference potential is set at about half of $V_{dd}$ ($V_{dd}/2$).

The DRAM cell also comprises a transistor 250. The transistor includes a gate stack 255 and source 251 and drain 252 regions. The drain and source regions comprise dopants of a second conductivity that have been implanted therein. A channel region 258 beneath the gate comprises dopants of the first conductivity. Although the substrate already comprise dopants of the first conductivity, an additional implant comprising dopants of the first conductivity is required to tailor the $V_t$ of the transistor.

The gate stack typically comprises a conductive layer 256, such as polycrystalline (poly), formed over a gate oxide (not shown). In some applications, a layer of silicide (not shown) is used to form a composite gate stack. Various silicides, including molybdenum ($MoSi_x$), tantalum ($TaSi_x$), tungsten ($WSi_x$), titanium silicide ($TiSi_x$) or cobalt silicide ($CoSi_x$), are used to form layer 114. Alternatively, aluminum or refractory metals, such as tungsten and molybdenum, are used alone or in combination with silicides or poly. Composite gates are desirable as their use reduces the sheet resistance of the gate, thereby decreasing the R-C delay of signals that are routed along it.

A nitride layer 255 is formed above conductive layer 256. This layer serves as an etch stop for subsequent process steps. A spacer (not shown) is optionally formed on the sidewalls of the gate to define the underlap diffusion of the source and drain regions into the gate region, which reduces overlap capacitance.

To facilitate efficient use of substrate area, a gate stack 180, which is isolated from to the cell by the STI, is typically formed over the trench 210. This gate stack represents the passing wordline in the DRAM array. Also shown in FIG. 1 is a gate stack of transistor 270 which is coupled to an adjacent trench (not shown). As shown, transistor 270 shared a common source with transistor 250. Such DRAM architecture is known in the art as a folded bitline architecture. Other architectures including open and open-folded are also useful. Such architectures are described in, for example, Takashima et al., IEEE, *Solid-State Circuits*, Vol 29, no. 4, pp. 539–542, (April 1994), which is herein incorporated by reference.

A nitride layer 283 is deposited on the surface of the substrate, covering the transistors and the substrate surface. The nitride layer serves as an etch stop. A dielectric layer (287) is formed over the nitride layer 283, providing insulation between the transistors and a bitline 280. The dielectric layer, for example, includes phosphorus-doped silicon dioxide such as phosphosilicate glass (PSG) or borophosphosilicate glass (BPSG).

A contact stud 275 connects the source 251 to the bitline. As shown, the contact is a boarderless contact comprising of, for example, poly doped with dopants having the same conductivity. Alternatively, a boardered contact stud or other contact stud is also useful. Additionally, a contact stud comprising tungsten, or other conductive material is also useful.

In accordance with the invention, the dopant profile in the channel is asymmetrical, as depicted by the dotted line. In particular, the peak concentration of dopants is situated near the source side of the channel and decreases toward the drain side which is connected to the capacitor 210 by strap 259. The exact location of the peak is not important. What is important is the fact that a graded profile results. That is, the peak of the profile is situated near the bitline side of the junction and gradually decreases towards the drain side of the junction. Such a profile divides the device into subsections, with each section having a different $V_t$. Since the bitline side of the junction has a higher concentration of dopants, it has a higher $V_t$. On the other hand, the drain side of the junction has a lower concentration of dopants, resulting in a lower $V_t$, compared to the bitline side of the device. This type of dopant profile enables circuit designers to achieve a $V_t$ that would result in a reasonable $I^{off}$ without adversely affecting the channel/drain junction, thereby reducing leakage from the capacitor 210. In one embodiment, the peak of the dopant profile is located laterally about 100 nm away from the bitline contact opening under the active wordline 270, and vertically about 30 nm below the silicon surface. The channel 258 of transistor 270 also comprises an asymmetrical dopant profile to reduce leakage between the capacitor connected to its drain (not shown).

Figure 3A:
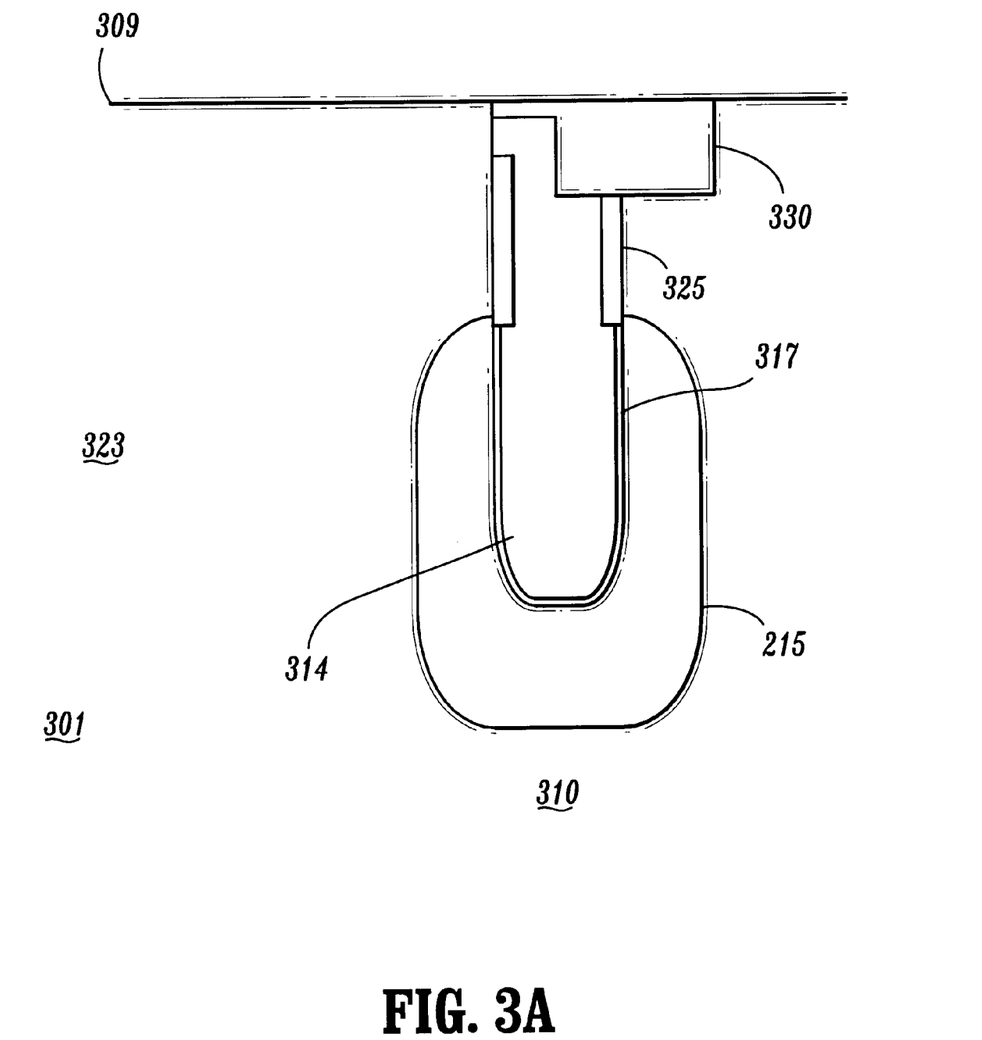
FIG. 3A–3E shows the process of forming a DRAM cell in accordance with one embodiment of the invention.

FIGS. 3a–e show the process for forming a transistor with asymmetrical dopant profile, as implemented in a DRAM cell. Referring to FIG. 3a, a trench capacitor 310 is formed in a substrate 301. The major surface of the substrate is not critical and any suitable orientation such as an (100), (110), or (111) is useful. In an exemplary embodiment, the substrate is lightly doped with p-type dopants (p).

The trench capacitor 310 is formed in the substrate by conventional techniques. Such techniques are described in, for example, Nesbit et al., *A 0.6 µm² 256 Mb Trench DRAM Cell With Self-Aligned BuriEd STrap (BEST)*, IEDM 93–627, which is already herein incorporated by reference for all purposes. Illustratively, the trench is filled with heavily doped n-type (n⁺) poly 314. The n⁺ poly serves as one plate of the capacitors. A n⁺ buried plate 315 surrounds the bottom portion of the trench and serves as the other plate of the capacitor. The trench and buried plate are isolated from each other by a node dielectric layer 317. In one embodiment, the node dielectric layer comprises nitride and oxide layers. In an upper portion of the trench, a collar 325 is formed. The collar comprises a dielectric material such as, for example TEOS. Additionally, a buried N well 323 is provided for connecting the other trenches in the array together. At the top of the trench, a STI 330 is formed. The STI provides isolation from other DRA cells. As shown, the surface of the substrate is planarized, providing a planar surface 309 for subsequent processing Next, p-type well regions for the p-channel access transistor of the DRAM cell are formed. Formation of the wells include, for example, forming a thin oxide layer over the substrate and depositing a mask layer, such as resist, (not shown) thereon. The oxide layer serves as a screen oxide during the well implants. The resist layer is then patterned to expose the p-well region. P-type dopants, such as boron (B) are implanted into the well region. The dopants are implanted sufficiently deep to prevent punchthrough. The dopant profile is tailored to achieve the desired electrical characteristics, such as gate threshold voltage ($V_t$).

In addition, n-wells for p-channel support circuitry are also formed. For complimentary wells in complimentary metal oxide silicon (CMOS) devices, n-wells are formed. Formation of N wells require additional lithographic and implant steps for defining and forming the N wells. As with the p-wells, the profile of the n-wells are tailored to achieve the desired electrical characteristics. After the implants, the oxide layer is removed.

Figure 3B:
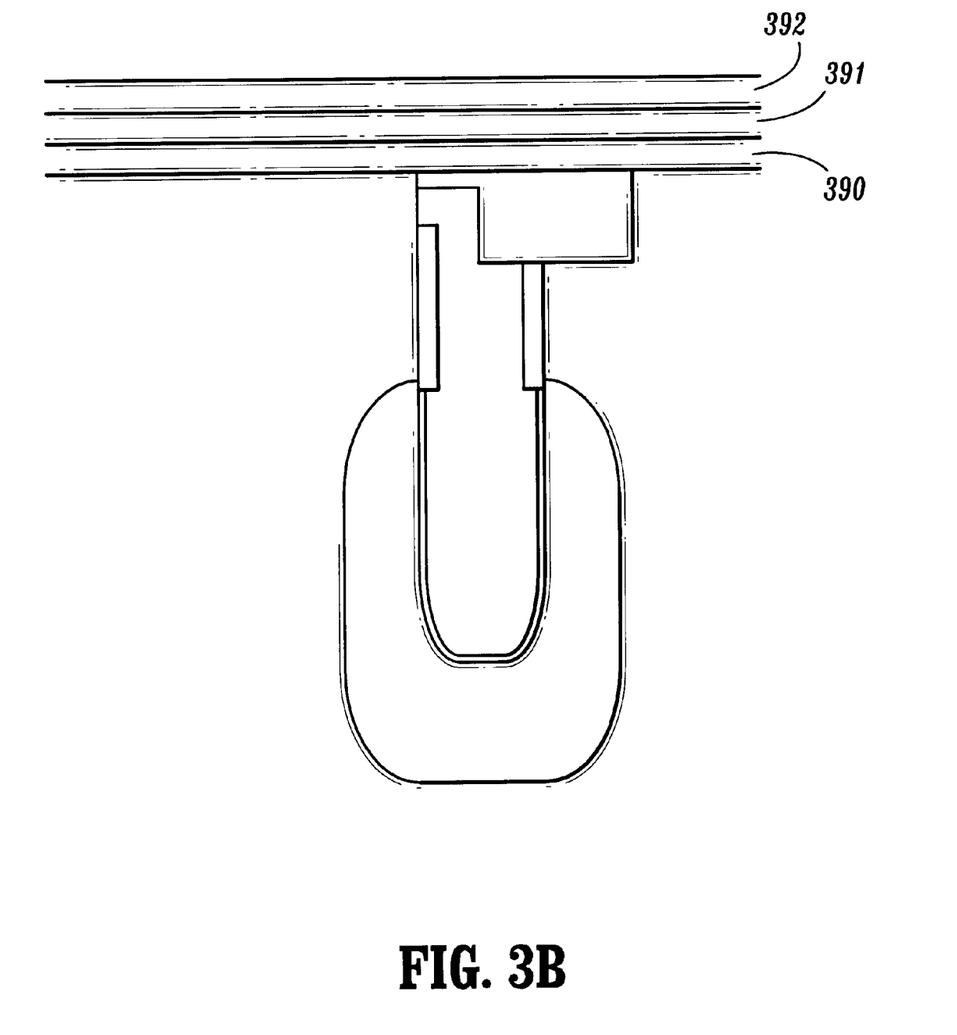

FIG. 3b shows the process for forming the transistors. As shown, a gate oxide layer is formed over the surface of the substrate. The oxide layer should be sufficiently thick to serve as the gate oxide for the gates of the transistors. Typically, the gate oxide is about 3.5–10 nm thick. Above the oxide layer are various layers that are used to form the gate of the transistors. These layers include poly 390, silicide 391, and dielectric layer 392.

Figure 3C:
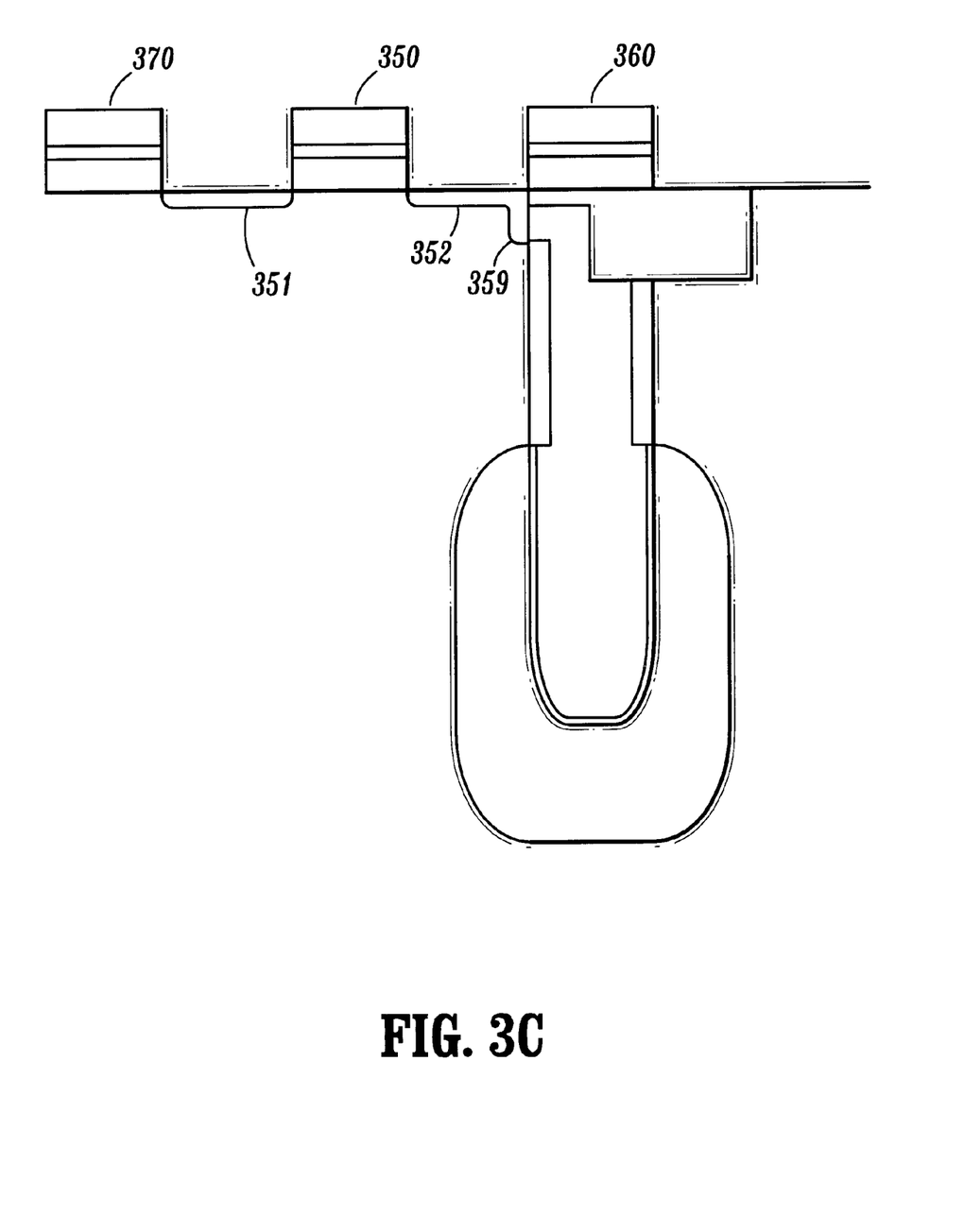

In FIG. 3c, gate stack layers are patterned using conventional lithographic and etching techniques to form the gate stack for various transistors. As shown, a gate stacks 350, 360, and 370 are formed. Gate stack 350 forms the access transistor coupled to the trench capacitor 310 of the DRAM cell and gate stack 370 forms the access transistor of an adjacent trench capacitor (not shown). Gate stack 360 is formed above and isolated from the trench capacitor 310 by STI 330. Gate stack 360 represents a passing wordline. As previously discussed, such an architecture is referred to as a folded-bitline architecture.

Using the gate stacks as an implant mask, n-type dopants are implanted into the substrate to form the drain 352 and source 351. Source 351 is a common source for transistors 350 and 370. A strap 359 is formed by diffusing dopants from the trench capacitor.

Figure 3D:
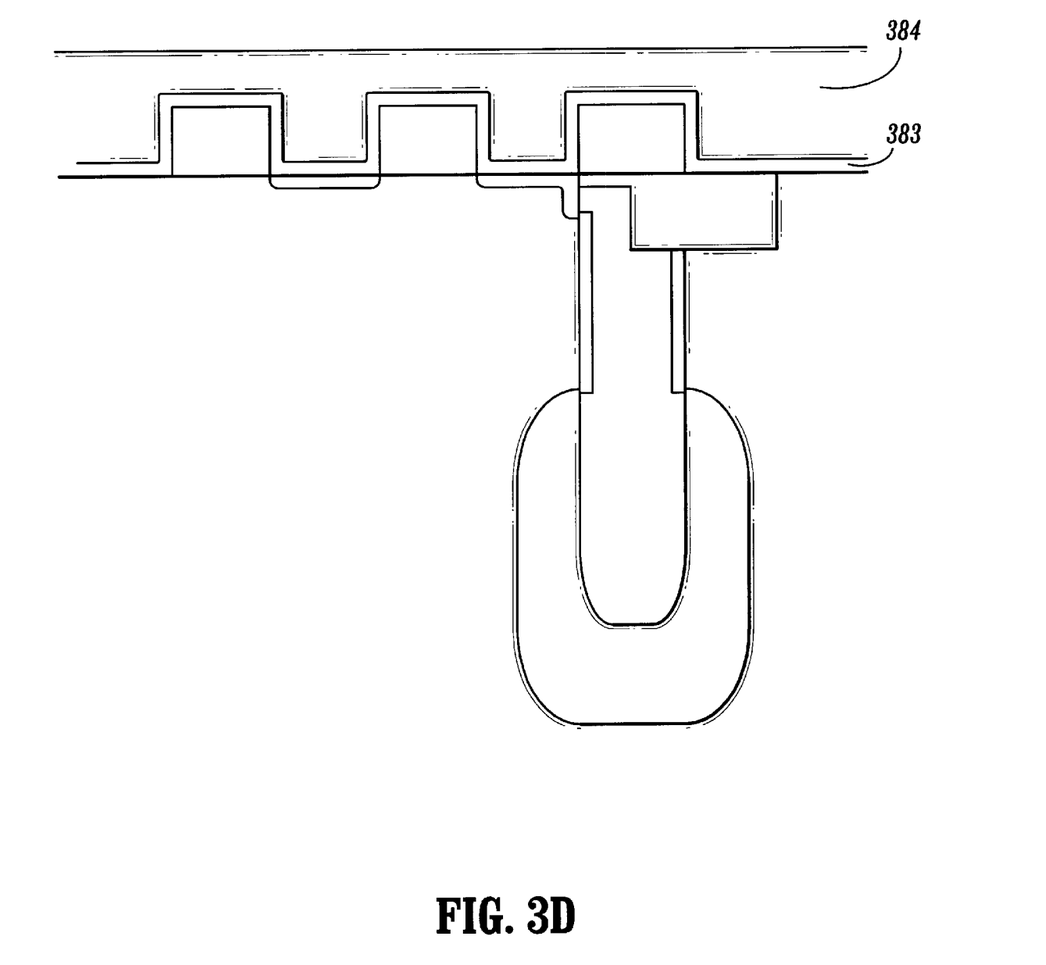

Referring to FIG. 3d, a nitride liner 383 is formed over the substrate surface, covering the gates as well. The nitride liner is provides a mobile ion barrier and also to serve as an etch stop. A dielectric layer 384 is formed over the device structure to provide insulation between the conducting layers. Also, the dielectric layer acts as a protective layer to insulate the device structure from impurities, moisture, and scratches. In one embodiment, the dielectric layer comprises, for example, phosphorus-doped silicon dioxide such as phosphosilicate glass (PSG) or borophosphosilicate glass (BPSG). The dielectric layer is planarized, leaving a planar surface 384.

Figure 3E:
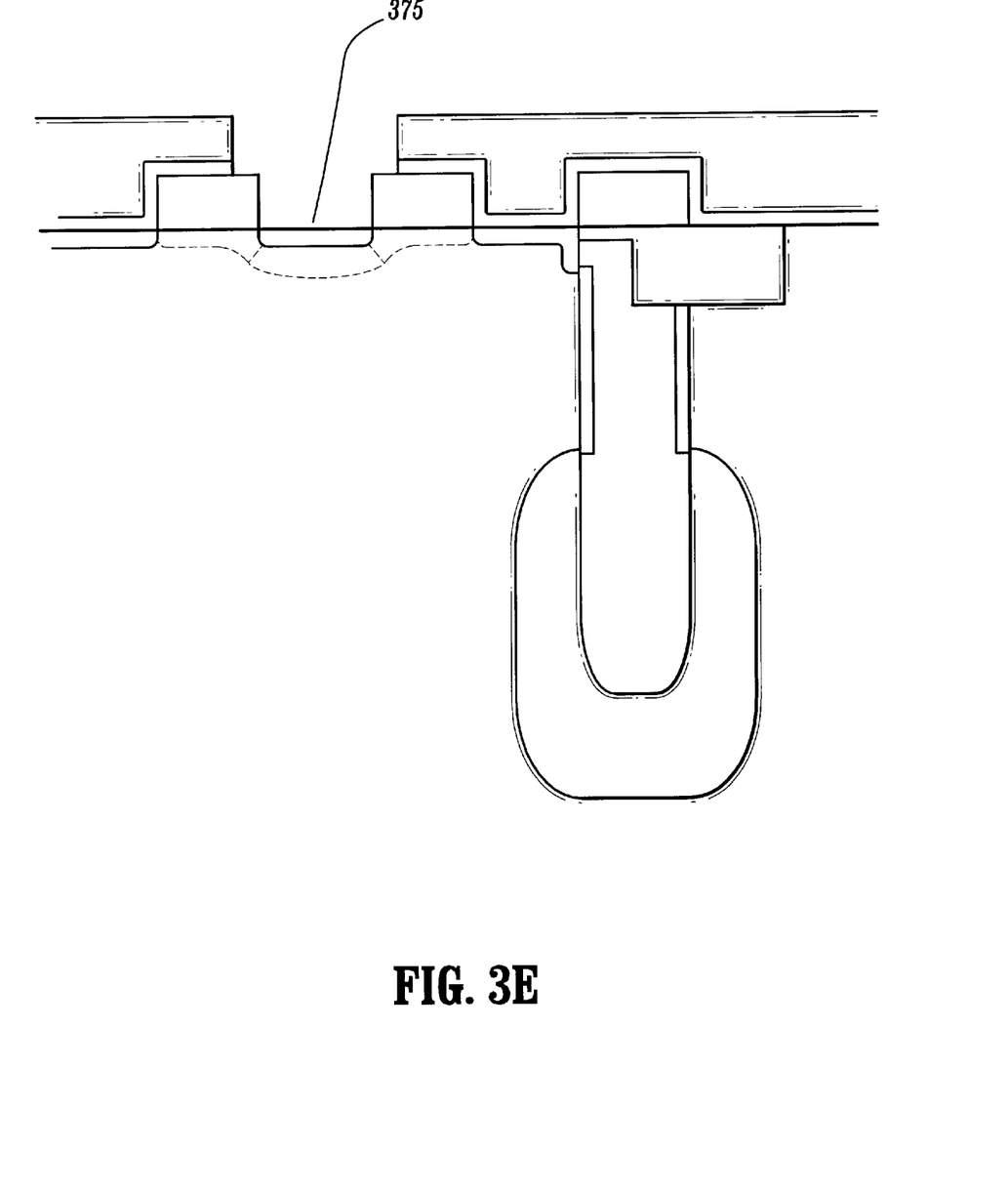

In FIG. 3e, a contact opening 375 is formed in the dielectric layer 384 over the source 351. The opening, as shown, is a boarderless contact wherein the contact opening overlaps a portion of the gates. Formation of boarderless contacts is described in, for example, Nesbit et al., *A 0.6 μm² 256 Trench DRAM Cell With Self-Aligned BuriEd STrap (BEST)*, IEDM 93–627, which is already herein incorporated by reference for all purposes. The dielectric layer serves as an implant mask, where dopants having the same conductivity as the channel are implanted into the substrate through the contact opening. The implant is used to adjust the $V_t$ of transistor. The implant, as depicted by the dotted line, creates an asymmetrical channel dopant profile.

Figure 4:
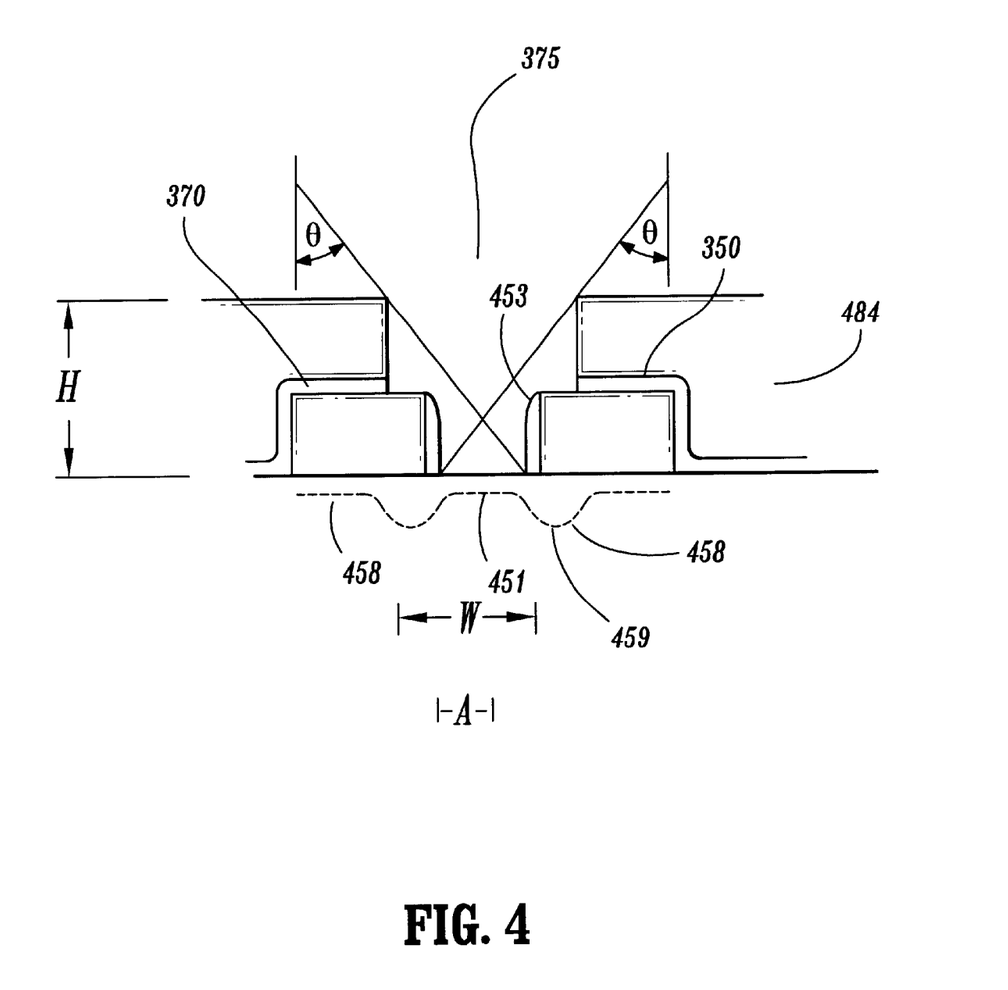
FIG. 4 shows the channel dopant profile in greater detail.

FIG. 4 shows the contact opening 375 in greater detail. In accordance with one embodiment of the invention, the B dopants are implanted through the contact opening to adjust the $V_t$ of the transistor 350. The B is implanted sufficiently deep so as not to adversely impact the dopant profile of the source 451, which comprises dopants of the opposite conductivity such as phosphorus (P). In one embodiment, the B dopants are implanted below the source implant so as not to affect the drain junction 452. Subsequent processes cause the B dopants to diffuse into the gate region of transistor 350. The diffusion results in an asymmetrical channel dopant profile 458. As shown, the channel dopant profile has a peak concentration 459 located on the source side of the gate.

In accordance with the invention, the dopants of the $V_t$ are implanted vertically or at an angle θ. The maximum angle θ of the implant depends of the aspect ratio of the contact opening. The aspect ratio is defined as the ratio between the diameter of contact opening and the thickness or height of the opening. Illustratively, the height of the contact opening is about H and the diameter of the opening, which is the portion of the contact opening exposing the source 451, is about W, resulting in an aspect ratio of H/W. The angle θ has a indirect relationship with the aspect ratio of the contact opening. That is, the greater the aspect ratio, the smaller the angle θ and conversely, the smaller the aspect ratio, the greater the angle θ. Generally, the performing the implant at an angle results in smaller amounts of the B located below the source, thereby reducing the capacitance at the source junction. Lower source capacitance, results in higher cell signals.

In one embodiment, the implant is performed at an angle between about 0 to θ, where θ is equal to about $\tan^{-1}(W/H)$. The angle also depends on the dose and energy of the implant as well as the thermal budget. For example, an angle larger than $\tan^{-1}(W/H)$ may be used with greater implant energy to drive the dopant atoms through the BPSG. A smaller angle may be desired when dealing with a large thermal budget. This places the peak initially near the bitline junction. As such, subsequent diffusion of the dopants would still not cause the peak concentration of the dopants to migrate towards the drain side of the junction. In another embodiment, the angle is from 0 to about 45°, preferably between 0 to about 10°.

In an exemplary embodiment, the contact opening has a height of about 500 nm and a width of about 200 nm. The $V_t$ is adjusted by implanting B at an angle of about 30 degrees. Implanting the B at such an angle has been found to provide a doping profile that dramatically improves the off current behavior of the array device.

Illustratively, a transistor 370 shares a common source with transistor 350. Transistor 370 is for example, the access transistor an adjacent memory cell. An implant at an angle of about −θ is performed in the same opening to adjust the $V_t$ of transistor 370.

By implanting dopants into the source region instead of directly into the channel region to adjust the $V_t$, the peak of the channel dopant profile is located on the source side to create an asymmetrical channel dopant profile. The asymmetrical channel dopant profile allows for an increase in $V_t$ without adversely affecting the integrity of the drain/channel junction. Therefore, electrical leakage from the drain side to the source side is reduced because of the higher integrity drain/channel and lower $I_{off}$ due to the higher $V_t$.

As described, the asymmetrical B dopant profile is controlled by the $V_t$ implant as well as the source implant comprising P. The resulting doping profile is dependent on the concentration of dopants used, their ability to migrate through the single crystal silicon substrate, and the path they take during the ion implantation process. Those skilled in the art will appreciate that implant parameters such as dose and power of implant can be varied to tailor the asymmetrical channel dopant profile to achieve the desired electrical characteristics. Additionally, subsequent processes which cause diffusion of dopants are also taken into consideration to design the desired asymmetrical dopant profile. These processes, or course, are taken into consideration to tailor the channel dopant profile to achieve the desired electrical characteristics.

Experiments

Figure 5A:
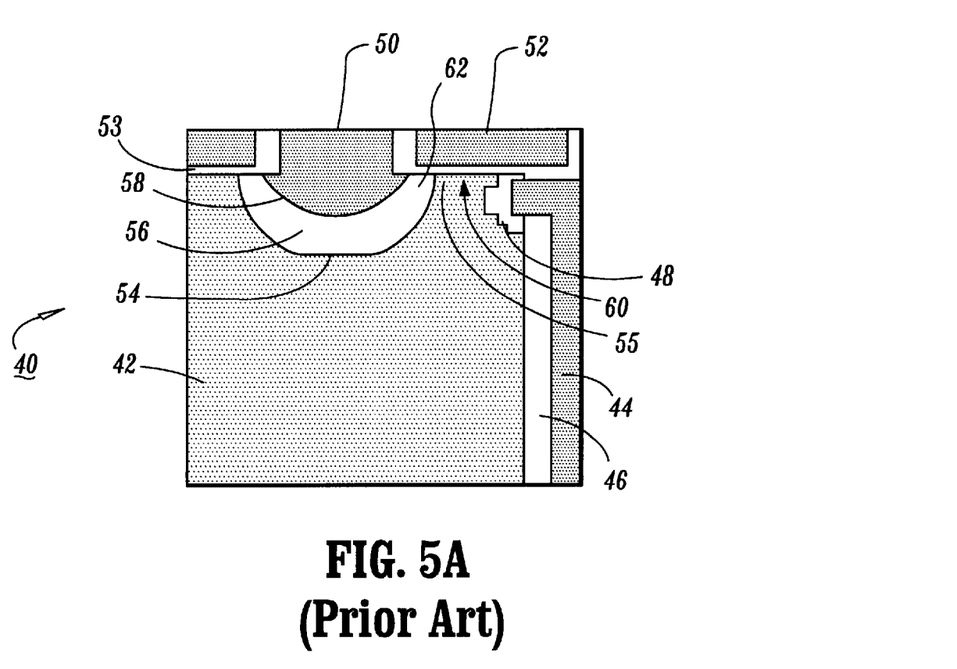
FIG. 5A depicts a cross-sectional view of the doping concentrations observed in a 256 MB DRAM cell using a conventional doping technique.
Figure 5B:
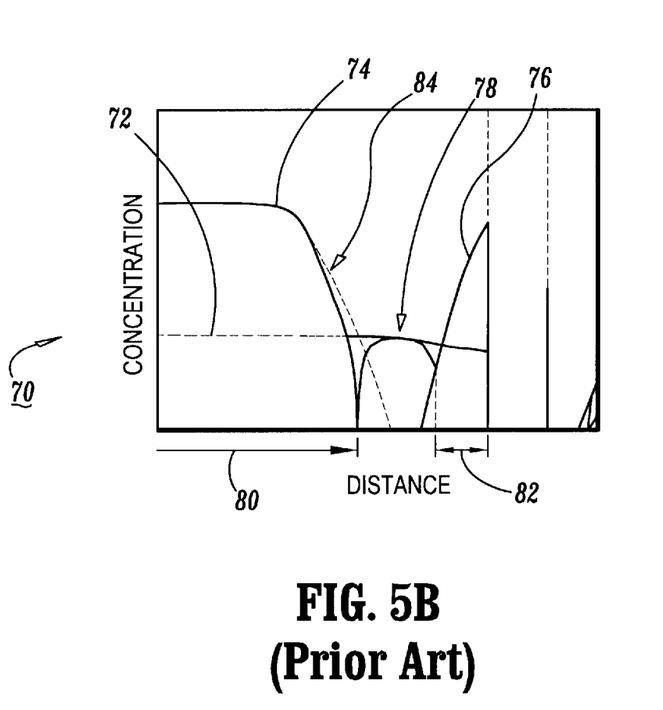
FIG. 5B depicts a plot of the doping profile of the prior art 256 MB cell of FIG. 5A along a horizontal line approximately 0.01 mm below the substrate surface.

An experiment was conducted comparing devices whose channel is formed by conventional techniques with those formed in accordance with the invention. In particular, the experiment examined dopant profiles of a transistor in a DRAM cell. The results of the experiments are shown in FIGS. 5–7. Referring to FIG. 5A, a SEM of a partial cross-sectional view of a conventional 256 MB DRAM cell 40 is shown. Such DRAN cell is described in, for example, U.S. patent application titled Ser. No. 08/340,500, titled "Unit Cell Layout and Transfer Gate Design For High Density DRAMs" filed on Nov. 15, 1994, which is herein incorporated by reference for all purposes. As shown, a polysilicon-filled trench capacitor 44 with oxide collar 46, buried strap region 48, and bit line junction region 54 is formed in a semiconductor substrate 42. The buried strap and bit line regions correspond to the drain and source regions. A boarderless contact region 50 is located directly above the bit line junction region 54. A word line 52 is disposed on an oxide film 53 on the surface of the substrate. The bit line junction region 54 has areas which are boron doped 56 and phosphorus doped 58. The buried strap region 48 is arsenic doped. Areas of high dopant concentration appear dark in the figure, while areas of lower concentration appear light. Of particular significance in FIG. 5B is the region 62 at the edge of the diffused bit line junction 54. This region contains primarily boron (h+) dopants and extends well into the channel region 55 under the word line 52. Such an extended area of boron dopant into the channel region is detrimental to the array device, causing electric leakage and poor off current characteristics.

The actual doping profile of the array device is more clearly shown in FIG. 5B. A plot 70 is provided which depicts the doping profile of the transistor. The plot measures the concentration of the various dopants at various regions of the transistor at approximately 0.01 below the substrate surface. Lines 72, 74, and 76 plot the concentrations of boron, phosphorus, and arsenic, respectively. The plot comprises of three primary regions: the bit line junction region 80, the channel region 78, and the buried strap region 82. Line 72 indicates that the concentration of phosphorus starts off relatively high in the bit line junction region 80 and decreases as one approaches the channel region 78. This concentration corresponds to a section of the dark region of phosphorus 58 in FIG. 5A, which slowly turns light near region 62 as the concentration of phosphorus atoms decreases. The concentration of arsenic atoms, as shown by line 76, is negligible in the channel region 78 and increases significantly as in the buried strap region 82. Line 72 shows that the concentration of boron atoms is relatively constant through the bit Line junction region 80, channel region 78, and buried strap region 82.

From FIG. 5B, it can be seen that a conventional transistor comprises a symmetrical dopant profile in its channel region. The channel dopant profile controls the $V_t$ of the transistor. Increasing the $V_t$ in order to reduce $I_{off}$ to desired levels requires a higher concentration of B in the channel. Since the dopant profile is symmetrical, increasing the dopant concentration results in higher dopant concentration throughout the channel. However, increasing the dopant concentration in the buried strap side of the junction adversely affects its integrity, thereby increasing leakage from the buried strap into the channel region.

Figure 6A:
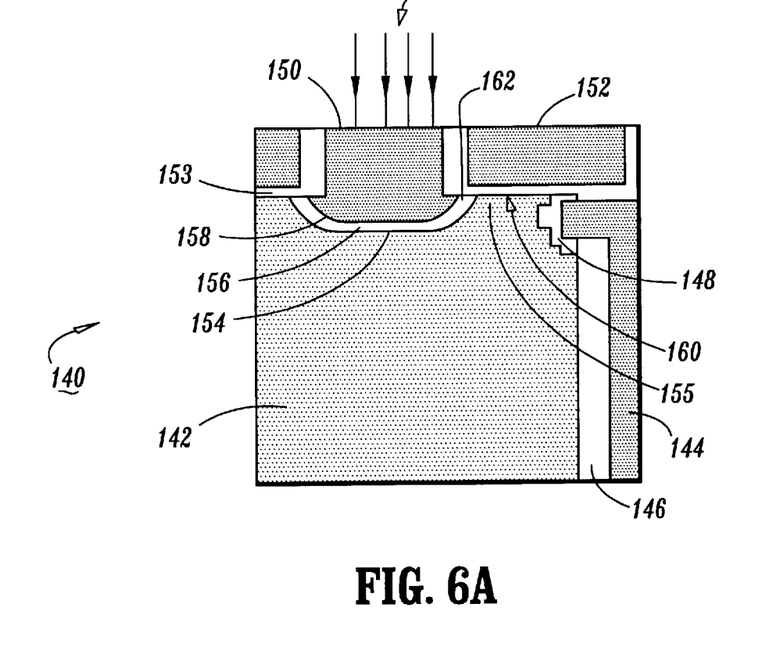
FIG. 6A depicts a cross-sectional view of the doping concentrations observed in a 256 MB DRAM cell using the straight contradoping process of the inventive method.
Figure 6B:
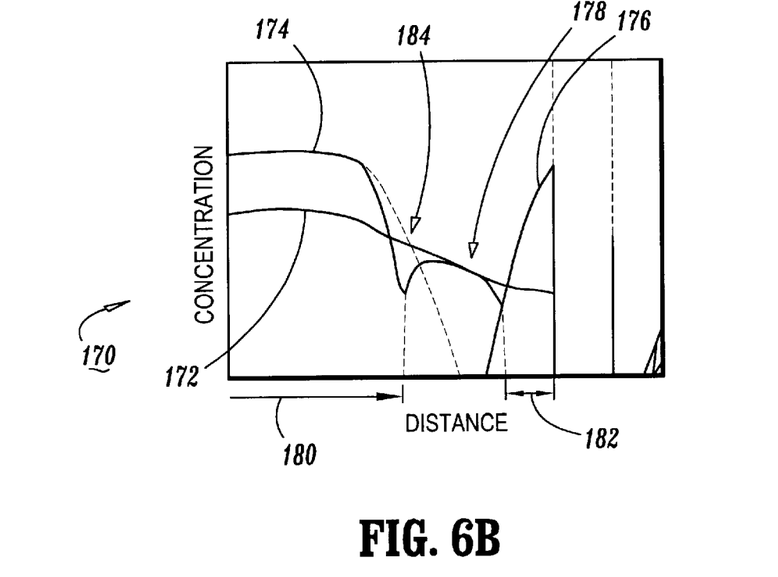
FIG. 6B depicts a plot of the doping profile of the 256 MB cell of FIG. 6A along a horizontal line approximately 0.01 mm below the substrate surface.
Figure 7A:
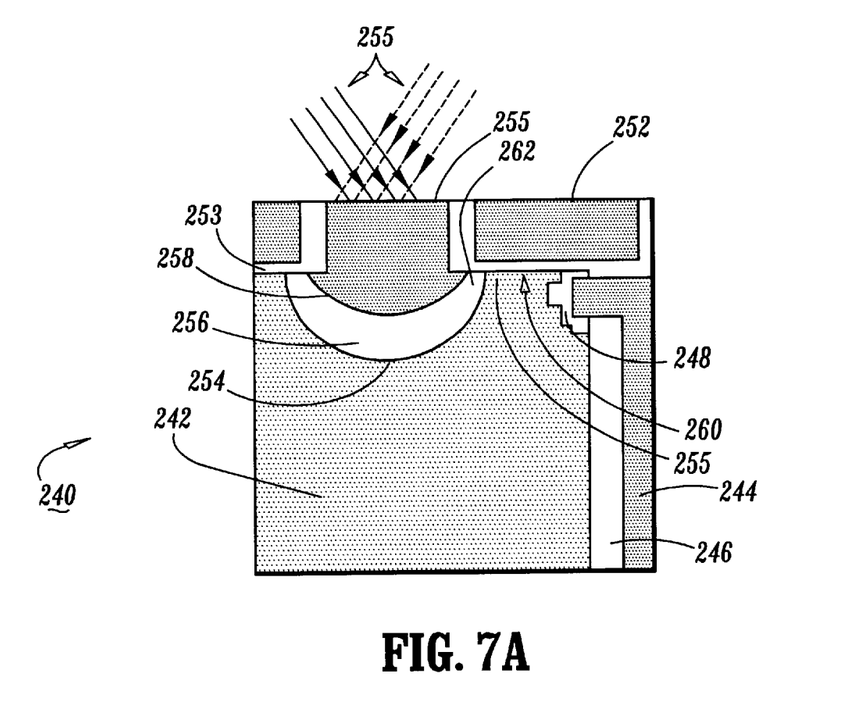
FIG. 7A depicts a cross-sectional view of the doping concentrations observed in a 256 MB DRAM cell using the tilted contradoping process of the inventive method.
Figure 7B:
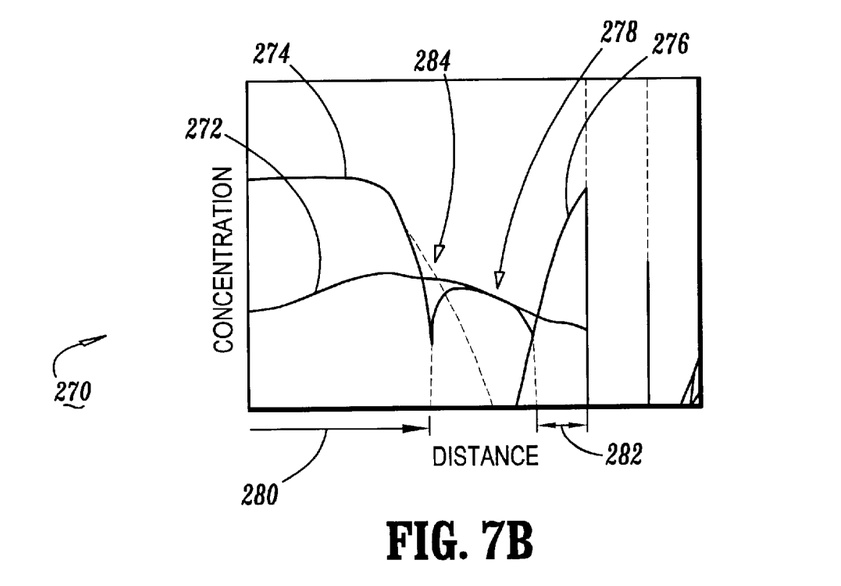
FIG. 7B depicts a plot of the doping profile of the 256 MB cell of FIG. 7A along a horizontal line approximately 0.01 mm below the substrate surface.

FIGS. 6A and 7A show a DRAM cell in which the access transistor comprises an asymmetrical dopant profile in accordance with the invention. FIGS. 6B and 7B plots the dopant profile corresponding to the transistor in 6A and 7B, respectively. Referring to FIG. 6A, the asymmetrical channel dopant profile is formed by implanting boron atoms through the bitline contact opening in a vertical direction (angle=θ°). The DRAM cell 140 comprises a polysilicon-filled trench capacitor 144 with oxide collar 146, a buried strap region 148, and a bit line junction region 154 formed in a semiconductor substrate 142. The boarderless contact region 150 is located directly above the bit line junction region 154. A word line 152 is disposed on an oxide film 153 on the surface of the substrate. The bit line junction region 154 has areas which are boron doped 156 and phosphorus doped 158. The buried strap region 148 is arsenic doped. As in FIG. 5A, areas of high dopant concentration appear dark in the figure, while areas of lower concentration appear light. As can be seen by comparing FIGS. 5A and 6A, the bit line junction region 154 of FIG. 6A is much narrower. This indicates that the concentration of B is higher in the bit line side of the channel than the buried strap side of the channel.

Referring to FIG. 6B, a plot indicating the doping profile of the transistor is provided. The plot measures the concentration of the various dopants at various regions of the transistor at approximately 0.01 mm below the substrate surface. Lines 172, 174. and 176 plot the concentrations of boron, phosphorus, and arsenic, respectively. The plot comprises three primary regions: the bit line junction region 180, the channel region 178, and the buried strap region 182. Line 172 indicates that the concentration of phosphorus starts off relatively high in the bit line junction region 180 and decreases in the channel region 178. This concentration corresponds to a section of the dark region of phosphorus 158 in FIG. 6A, which slowly turns light near region 162 as the concentration of phosphorus atoms decreases. The concentration of arsenic atoms, as shown by line 176, is negligible in the channel region 178 and increases signifi-cantly in the buried strap region 182. Line 172 shows that the concentration of boron atoms is relatively higher in bit line junction and continually decreases in the channel region 182. Thus, by implanting the bit line junction region with boron atoms and allowing them to diffuse toward the channel region, an asymmetrical channel dopant profile results.

From FIG. 6B, it can be seen that implanting boron atoms into the bit line region creates an asymmetrical channel dopant profile. In particular, the channel dopant profile has its peak in the bit line side of the channel. As such, increasing the concentration of boron to achieve a higher $V_t$ would not adversely affect the dopant profile in the buried strap side of the channel. Also FIG. 6B shows that the relative concentration of boron to phosphorous is closer than that compared with the plot of FIG. 5B, resulting in an increase in capacitance in the bit line junction.

Referring to FIG. 7A, a SEM of a DRAM cell 240 is shown. The DRAM cell 240 comprises a polysilicon-filled trench capacitor 244 with oxide collar 246, a buried strap region 248, and a bit line junction region 254 formed in a semiconductor substrate 242. The boarderless contact region 250 is located directly above the bit line junction region 254. A word line 252 is disposed on an oxide film 253 on the surface of the substrate.

The bit line junction region 254 has areas which are boron doped 256 and phosphorus doped 258. The buried strap region 248 is arsenic doped. The boron atoms are implanted through the bit line junction at an angle of about 30°. The angled paths taken by the dopants is given reference numeral 255 in FIG. 7A. As in FIG. 5A, areas of high dopant concentration appear dark in the figure, while areas of lower concentration appear light.

Referring now to FIG. 7B, a plot 270 indicating the doping profile of the transistor in FIG. 7A is provided. The plot measures the concentration of the various dopants at various regions of the transistor at approximately 0.01 mm below the substrate surface. Lines 272, 274. and 276 plot the concentrations of boron, phosphorus, and arsenic, respectively. The plot comprises three primary regions: the bit line junction region 280, the channel region 278, and the buried strap region 282. Line 272 indicates that the concentration of phosphorus starts off relatively high in the bit line junction region 280 and decreases in the channel region 278. This concentration corresponds to a section of the dark region of phosphorus 258 in FIG. 7A, which slowly turns light near region 262 as the concentration of phosphorus atoms decreases. The concentration of arsenic atoms, as shown by line 276, is negligible in the channel region 278 and increases significantly in the buried strap region 282. Line 272 shows that the concentration of boron atoms is relatively lower and increases slightly until it peaks near the junction of the bit line and channel regions. From there, the concentration of boron continually decreases. Thus, by implanting the bit line junction region with boron atoms and allowing them to diffuse toward the channel region, an asymmetrical channel dopant profile results. Additionally, implanting the boron atoms at an angle results in a greater disparity between the concentration of boron and phosphorous than that shown in FIG. 6B, thereby reducing the bit line capacitance.

As should now be readily apparent, the present invention employs the use of asymmetrical dopant profiles to improve the off current characteristics of the device without adversely affecting the other junction of the device. The asymmetrical channel dopant profile is achieved by implanting the channel dopants through the contact opening in, for example, the source region.

It should be understood that the embodiments described herein are merely exemplary and that a person skilled in the art may make reasonable variations and modifications to these embodiments utilizing functionally equivalent elements to those described herein. For example, although described herein specifically with reference to a 256 MB DRAM cell, it should be understood that the process will work equally well in memory cells of different configurations as well as other logic devices as well. Also, although a tilt angle of 30° is preferred when using the angled ion implantation method, other angles corresponding to other aspect ratios of the bit line contact opening are possible, and will work equally well with the method. Any and all such variations or modifications, as well as others which may become apparent to those skilled in the art, are intended to be included within the scope of the invention as defined by the appended claims.

What is claimed is:

1. A DRAM cell of the type including a plurality of trench storage capacitors formed in a semiconductor substrate, a plurality of shallow trench isolation structures operative to isolate said trench storage capacitors from adjacent trench storage capacitors, and a plurality of word lines associated with said trench storage capacitors via buried straps and doped channel regions in said semiconductor substrate, the improvement therewith comprising:

a bit line junction disposed in said substrate, said bit line junction region comprising dopants of a first conductivity; and an asymmetrical channel dopant profile formed in the semiconductor substrate in the doped channel regions to prevent junction leakage while preserving integrity of the channel, the asymmetrical dopant profile continuously extending across a width of a wordline and including dopants of an opposite conductivity to the first conductivity, and the dopant profile further including a portion disposed deeper into the semiconductor substrate than the bit line junction.

2. The DRAM of claim 1, wherein the asymmetrical dopant profile is distributed such that a resulting contradoping profile includes a peak dopant concentration on a side of the channel region closest to the bit line junction.

3. The DRAM of claim 1, wherein the dopants of the first conductivity comprise phosphorous.

4. The DRAM of claim 1, wherein said bit line junction includes vertically implanted dopants.

5. The DRAM of claim 1, wherein said bit line junction region includes angled dopant implants.

6. The DRAM of claim 5, wherein said angled dopant implants are introduced at an angle of approximately 7 degrees.

7. The DRAM of claim 1, wherein the dopants of opposite conductivity comprise boron.

8. The DRAM of claim 1, wherein the bit line junction includes a source region and the asymmetrical dopant profile is distributed such that a resulting contradoping profile includes a peak dopant concentration on a side of the channel region closest to the source region.

9. A DRAM memory cell comprising:

a transistor device including a source region and a drain region formed in a semiconductor substrate and a gate disposed between the source and drain region on gate oxide formed on the semiconductor substrate, the source and drain regions including a first dopant having a first conductivity; and an asymmetrical channel dopant profile formed in the semiconductor substrate below the gate and continuously extending across a width of the gate, the asymmetrical dopant profile including dopants of an opposite conductivity to the first conductivity and the asymmetrical channel dopant profile further including a portion disposed deeper in the semiconductor substrate than the source and drain regions, the asymmetrical channel dopant profile for preventing junction leakage while preserving integrity of the channel.

10. A DRAM cell of the type including a plurality of trench storage capacitors formed in a semiconductor substrate, a plurality of shallow trench isolation structures operative to isolate said trench storage capacitors from adjacent trench storage capacitors, and a plurality of word lines associated with said trench storage capacitors via buried straps and doped channel regions in said semiconductor substrate, the improvement therewith comprising:

a bit line junction disposed in said substrate, said bit line junction region comprising dopants of a first conductivity; and an asymmetrical channel dopant profile formed in the semiconductor substrate in the doped channel regions to prevent junction leakage while preserving integrity of the channel, the asymmetrical dopant profile continuously extending across a width of a wordline and including dopants of an opposite conductivity to the first conductivity and the dopant profile further including a portion disposed deeper into the semiconductor substrate than the bit line junction wherein the asymmetrical dopant profile is distributed such that a resulting contradoping profile includes a peak dopant concentration on a side of the channel region closest to the bit line junction.

11. The DRAM of claim 10, wherein the dopants of the first conductivity comprise phosphorous.

12. The DRAM of claim 10, wherein the bit line junction includes vertically implanted dopants.

13. The DRAM of claim 10, wherein the bit line junction region includes angled dopant implants.

14. The DRAM of claim 13, wherein the angled dopant implants are introduced at an angle of approximately 7 degrees.

15. The DRAM of claim 10, wherein the dopants of an opposite conductivity comprise boron.

16. The DRAM of claim 10, wherein the bit line junction includes a source region and the asymmetrical dopant profile is distributed such that a resulting contradoping profile includes a peak dopant concentration on a side of the channel region closest to the source region.

* * * * *